United States Patent [19]

Jastrzebski et al.

[11] Patent Number: 4,923,826
[45] Date of Patent: May 8, 1990

[54] METHOD FOR FORMING DIELECTRICALLY ISOLATED TRANSISTOR

[75] Inventors: Lubomir L. Jastrzebski, Plainsboro; Ronald J. Johansson, Lawrenceville; Donald J. Sauer, Allentown, all of N.J.

[73] Assignee: Harris Corporation, Melbourne, Fla.

[21] Appl. No.: 388,416

[22] Filed: Aug. 2, 1989

[51] Int. Cl.⁵ .......................................... H01L 21/82
[52] U.S. Cl. ...................................... 437/57; 437/62; 437/89
[58] Field of Search ................... 437/62, 67, 89, 56, 437/57, 58

[56] References Cited

U.S. PATENT DOCUMENTS

| | | | |
|---|---|---|---|
| 3,689,357 | 9/1972 | Jordan | 161/119 |
| 3,938,176 | 2/1976 | Sloan, Jr. | 357/49 |
| 4,482,422 | 11/1984 | McGinn et al. | 156/612 |
| 4,530,149 | 7/1985 | Jastrzebski et al. | 29/571 |
| 4,549,926 | 10/1985 | Corboy, Jr. et al. | 156/612 |
| 4,554,570 | 11/1985 | Jastrzebski et al. | 357/23.4 |
| 4,557,794 | 12/1985 | McGinn et al. | 156/612 |
| 4,566,025 | 1/1986 | Jastrzebski et al. | 357/42 |
| 4,578,142 | 3/1986 | Corboy, Jr. et al. | 156/612 |
| 4,586,240 | 5/1986 | Blackstone et al. | 29/571 |
| 4,592,792 | 6/1986 | Corboy, Jr. et al. | 148/175 |
| 4,615,762 | 10/1986 | Jastrzebski et al. | 156/628 |
| 4,619,033 | 10/1986 | Jastrzebski | 29/571 |
| 4,685,199 | 8/1987 | Jastrzebski | 437/54 |
| 4,698,316 | 10/1987 | Corboy, Jr. et al. | 437/89 |
| 4,704,186 | 11/1987 | Jastrzebski | 156/612 |

FOREIGN PATENT DOCUMENTS 60-144949 7/1985 Japan ........................ 437/62
61-174736 8/1986 Japan ........................ 437/67

OTHER PUBLICATIONS

"Low-Threshold Low-Power CMOS/SOS for High-Frequency Counter Applications", A. C. Ipri et al., IEEE Journal of Solid-State Circuits, vol. SC-11, No. 2, Apr. 1976, pp. 329-336.

Primary Examiner—Olik Chaudhuri
Attorney, Agent, or Firm—K. R. Glick

[57] ABSTRACT

A method for forming dielectrically isolated devices comprises forming a first insulating layer on a flat monocrystalline surface of a silicon wafer. A plurality of active regions is defined on the surface using existing manufacturing masks. Portions of the insulating layer not included in the device regions are removed, leaving apertures. Silicon is epitaxially deposited within the apertures and over the first insulating layer so as to form a continuous monocrystalline layer. The surface of the monocrystalline is oxidized. The resulting oxide is then removed, thereby exposing the surface of the monocrystalline layer having its thickness reduced. A second insulating layer is formed over the monocrystalline layer, and a layer of silicon nitride is deposited over the second insulating layer. The plurality of active regions is defined on the layer of silicon nitride, again using existing manufacturing masks. Portions of the silicon nitride layer and the second insulating layer not included within the active regions are removed. Portions of the monocrystalline silicon layer thus exposed are oxidized to form oxide-isolated island portions of the monocrystalline silicon layer. The remaining portions of the silicon nitride and the second insulating layer are removed and devices are formed in the island portions.

11 Claims, 3 Drawing Sheets

METHOD FOR FORMING DIELECTRICALLY ISOLATED TRANSISTOR

FIELD OF THE INVENTION

The present invention relates generally to a method for fabricating complementary metal oxide semiconductor (CMOS) transistors on a wafer, wherein transistors as formed are individually dielectrically isolated from one another. More particularly, the invention relates to a method for forming such devices in an economical manner, particularly with regard to the cost of manufacturing masks typically utilized in such fabrication.

BACKGROUND OF THE INVENTION

Complementary metal oxide semiconductor (CMOS) devices comprising interconnected P channel and N channel metal oxide semiconductor (MOS) transistors are commonly used in the semiconductor art.

Typically, such P channel MOS (PMOS) and N channel MOS (NMOS) transistors are formed in monolithic structures on a silicon wafer, wherein devices are individually electrically isolated by the formation of reverse biased junctions in a manner known in the art. While such junction isolation suffices for a number of applications, there are certain other applications, such as those in which a "radiation hardened" structure is needed, where it is unsuitable. For effective isolation between various transistors in a radiation hardened device, it is desirable to interpose a layer of dielectric material between devices so as to obtain dielectrically isolated (DI) devices. Devices utilizing dielectric isolation are known in the art, as is described for example in U.S. Pat. No. 3,689,357 "GLASS-POLYSILICON DIELECTRIC ISOLATION" issued Sept. 5, 1972 and U.S. Pat. No. 3,938,176 "PROCESS FOR FABRICATING DIELECTRICALLY ISOLATED SEMICONDUCTOR COMPONENTS OF AN INTEGRATED CIRCUIT". However, such prior conventional techniques are expensive to implement, particularly when it is desired to effect a changeover from junction isolation to dielectric isolation. For example, if a CMOS device is being manufactured using junction isolation and it is desired to fabricate essentially the same device using dielectric isolation, an altogether different process must generally be used, requiring a different set of steps, including different masking operations with a different set of masks. Such new masks are expensive items, not only because of the precise manufacturing procedures required, but also because of the involved processes of checking and verification by proving out correct operation that are typically required before such masks can be put into service for mass production.

SUMMARY OF THE INVENTION

In accordance with an aspect of the invention, a method for forming dielectrically isolated transistors on a silicon wafer comprises providing a silicon wafer having both a substantially flat major surface, and a monocrystalline portion at the major surface. The invention permits the use of existing manufacturing masks or photomasks, previously used to form devices used in bulk silicon reverse biased junction isolated circuits. A first insulating layer on the major surface and a plurality of device regions of the major surface is defined thereon. Portions of the first insulating layer in regions of the surface not included in the device regions are removed so as to form a plurality of apertures therethrough exposing the monocrystalline portion, the apertures being spaced no wider apart than a predetermined distance. Silicon is epitaxially deposited within the apertures and over the first insulating layer so as to form a continuous monocrystalline layer having a thickness substantially equal to the predetermined distance. Substantially all of the surface of the monocrystalline silicon layer is oxidized so as to transform a uniformly thick layer of the silicon layer into oxide. All of the oxide is removed for exposing a surface of the silicon layer. A second insulating layer is formed over the silicon layer, and a layer of silicon nitride ($Si_3N_4$) is deposited over the second insulating layer. The same plurality of device regions is defined on the layer of silicon nitride. Portions of the silicon nitride and the second insulating layer not included within the device regions are removed so as to form apertures therethrough exposing the surface of the silicon layer. The silicon layer is treated such as to replace the silicon layer with a dielectric down to the major surface of the silicon wafer to provide dielectric isolation between ones of the plurality of device regions. Transistors are then formed in respective ones of the plurality of device regions.

BRIEF DESCRIPTION OF THE DRAWING

FIGS. 1 through 10A illustrate a sequence of process steps of one embodiment of the invention;

The figures are in diagrammatic form and are not to scale. Like reference numerals in the different figures designate like features.

DETAILED DESCRIPTION OF THE PREFERRED EMBODIMENTS OF THE INVENTION

Figure 1:
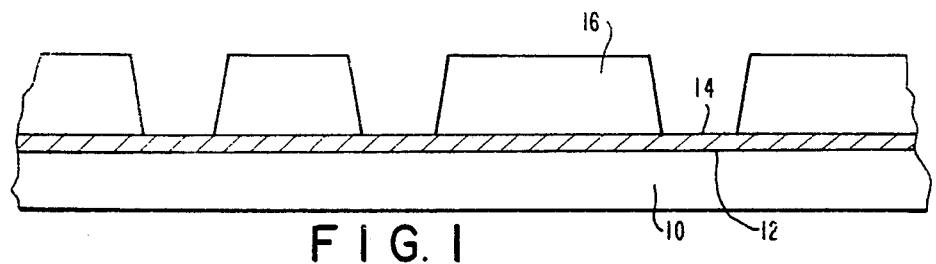

In the exemplary preferred embodiment shown in FIG. 1, a substrate 10 having a substantially flat or planar major surface 12 is initially provided. Preferably, substrate 10 is of silicon and surface 12 corresponds with a major crystallographic surface. A layer 14, which in the preferred embodiment comprises a silicon dioxide ($SiO_2$) layer of approximately 200 Angstroms (Å) in thickness is disposed on substrate surface 12. An apertured mask 16 of photoresist is formed on layer 14. Mask 16 can be formed by a mask pattern utilized in defining devices such as transistors to be formed monolithically by a process resulting in conventional reverse-biased junction isolation between devices. Thus, the mask pattern for mask 16 can have been previously utilized in the manufacture of junction isolated circuits, which are desired to be manufactured with dielectric isolation. Apertured mask 16 exhibits protective portions, that is, opaque portions, corresponding to active areas wherein devices such as transistors are to be formed, as will subsequently be explained. Furthermore, mask 16 exhibits apertures corresponding to regions which are to provide dielectric isolation for the active areas, as will be subsequently discussed.

Figure 2:
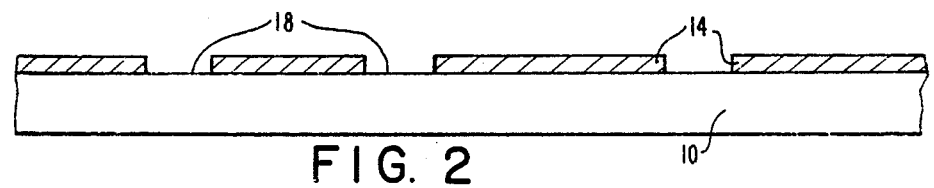

Portions of layer 14 which are exposed through apertures in mask 16 are then stripped from surface 12, for example, by a selective wet chemical etch such as buffered HF. A selective etchant, such as buffered HF will effectively remove all of the portions of silicon dioxide layer 14 exposed thereto, without damaging surface 12 of substrate 10. The structure resulting from the stripping of unmasked portions of layer 14 is shown in FIG. 2. The portions of layer 14 remaining also function as a mask for a following processing step.

Portions of surface 12 exposed by apertures in layer 14 will be hereinafter referred to as a nucleation site 18. Nucleation sites 18 in FIG. 2 can be located anywhere on surface 12. It is only necessary that each nucleation site be monocrystalline in structure. This can be achieved, for example, by providing that substrate 10 be of bulk monocrystalline material; that a monocrystalline layer be provided across surface 12 of an otherwise non-single-crystalline substrate 10; or that a poly-crystalline surface 12 exhibit a grain size such that each aperture can be defined within the boundaries of a grain.

Figure 3:
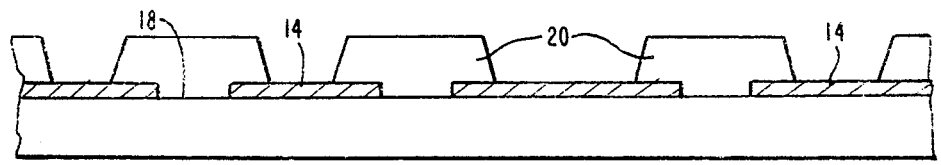
Figure 4:
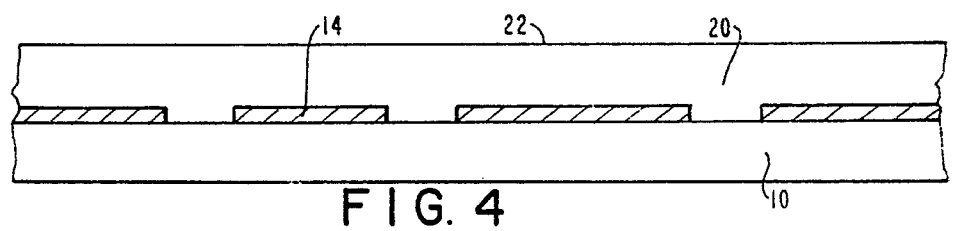

The masked structure of FIG. 2 is thereafter subjected to a two stage silicon deposition cycle, essentially as described in U.S. Pat. No. 4,549,926 "METHOD FOR GROWING MONOCRYSTALLINE SILICON ON A MASK LAYER", issued Oct. 29, 1985, herein incorporated by reference. The portion of the present description pertaining to this step is substantially in accordance with the account given in that patent. In the first stage of a process of this type, hereinafter referred to as the deposition stage, silicon is deposited from a gas mixture which includes a silicon-source gas and a carrier gas. Additionally, a silicon-etching gas can be included during the deposition stage. In the second stage, hereinafter referred to as the etching stage, a portion of the silicon deposited during the first stage is etched in a gas mixture of a silicon-etching gas and a carrier gas. This deposition/etching cycle is then repeated until a monocrystalline silicon layer of predetermined size is formed on layer 14. At each nucleation site 18, crystalline growth will proceed substantially vertically (perpendicularly to surface 12) through the thickness of layer 14, and thereafter will in addition proceed laterally, across the surface of layer 14, as shown in FIG. 3. Repetition of the cycle described will eventually yield a monocrystalline silicon island at each nucleation site 18 and eventually the plurality of silicon islands will grow together so as to form a continuous monocrystalline silicon layer 20, having a substantially planar surface 22 as shown in FIG. 4. This layer is also referred to as an epitaxial lateral overgrowth (ELO) layer.

Figure 5:
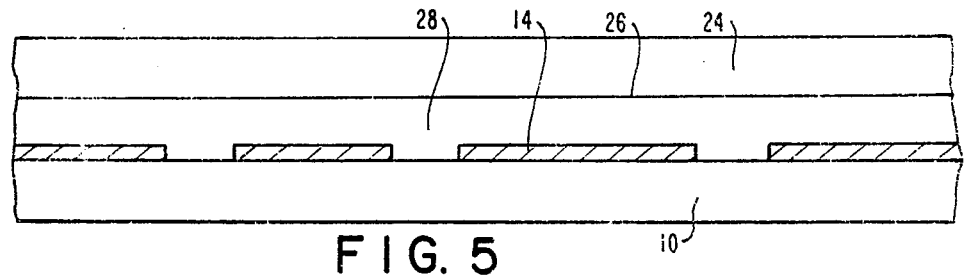

Monocrystalline silicon layer 20 is then reduced in thickness in accordance with known principles as described in U.S. Pat. No. 4,615,762 "METHOD FOR THINNING SILICON", issued Oct. 7, 1986, herein incorporated by reference. The portion of the present description pertaining to this step is substantially in accordance with the account given in that patent. Accordingly, the structure of FIG. 4 is then subjected to a process step whereby monocrystalline silicon layer 20 is oxidized so as to yield the structure shown in FIG. 5. As is known, oxidation of a silicon surface involves a certain quantity of silicon at that surface. Thus, as a result of the formation of silicon oxide layer 24 shown in FIG. 5, surface 22 of monocrystalline silicon layer 20 of FIG. 4 is hereinafter designated as surface 26 of monocrystalline layer 28 of FIG. 5. As described in the aforementioned Patent No. 4,615,762, the oxidation thickness required to obtain a desired thickness of silicon layer 28 from a starting thickness of layer 20 is known according to well-established principles. The desired oxide thickness may be achieved in a single oxidation step by exposure to a predetermined temperature, for a predetermined time at a predetermined atmospheric pressure, according to established data. Alternatively, the oxidation may be performed in several steps, by oxidizing, stripping the oxide, and reoxidizing.

Figure 6:
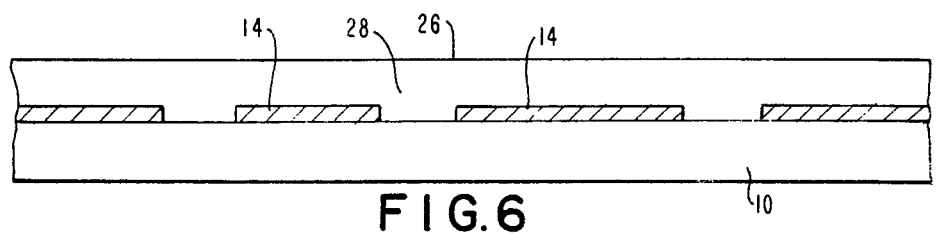

As shown in FIG. 6, oxide layer 24 is then stripped from silicon layer 28, for example, by a selective wet chemical etch such as buffered HF. As has been stated above, a selective etchant, such as buffered HF will effectively remove all of the portions of silicon dioxide layer 24 exposed thereto, without damaging surface 26 of silicon layer 28. Accordingly, surface 26 remains in its original crystalline condition.

Figure 7:
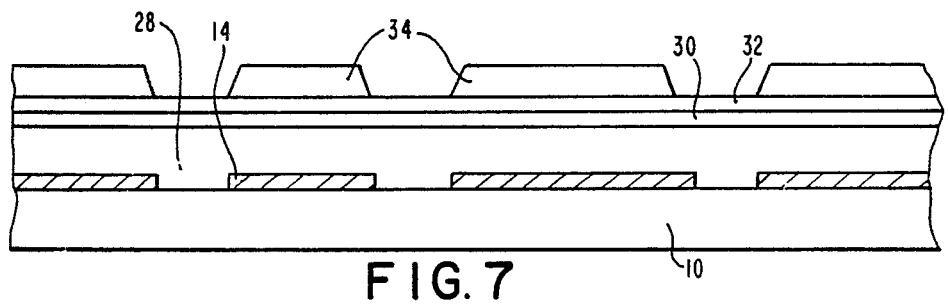

Thereafter, as shown in FIG. 7, surface 26 of silicon layer 28 is again oxidized, this time to form an oxide layer 30 having a thickness in the order of 200Å to 1000Å. A layer 32 of silicon nitride, ($Si_3N_4$), having a thickness in the order of 1000Å to 5000Å is then deposited over oxide layer 30. Next, a photoresist mask 34 is formed on silicon nitride layer 32, utilizing the mask pattern referred to above in the formation of mask 16, or a mask pattern substantially the same as that pattern.

Figure 8:
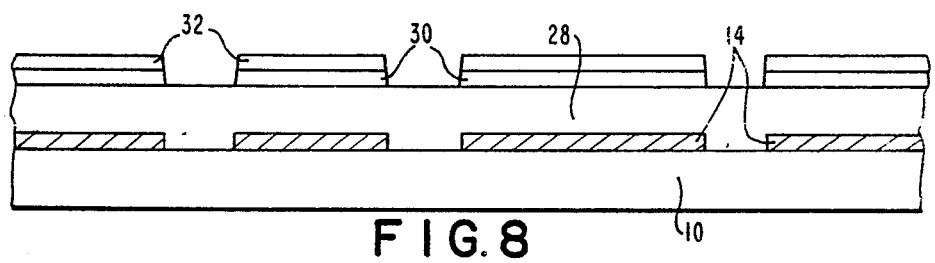

Next, portions of silicon nitride layer 32 and oxide layer 30 which are exposed through apertures in mask 34 are removed by etching and the photoresist is removed, as shown in FIG. 8. Thus, portions of silicon nitride layer 32 and oxide layer 30 which, as defined by mask 34, are in regions corresponding to active areas wherein devices such as transistors are to be formed, are not removed. The photoresist is then removed. It is noted as a significant result that the pattern of silicon nitride over oxide which remains at this stage corresponds to and is aligned with the pattern formed by oxide layer 12 in FIG. 2 and subsequent figures.

Figure 9:
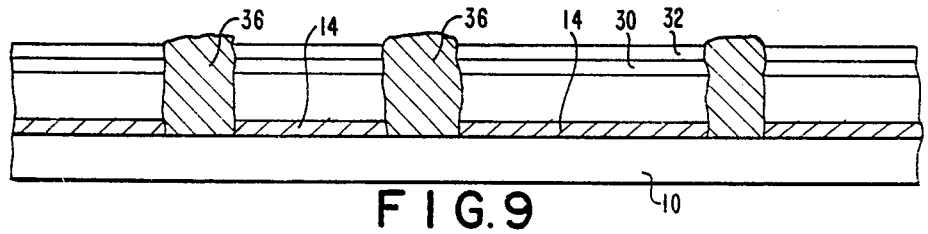
Figure 10A:
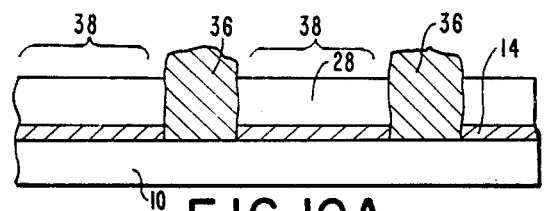
Figure 10B:
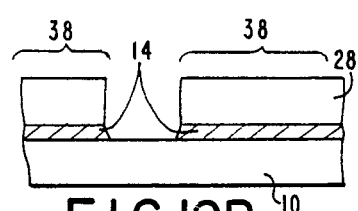
FIG. 10B illustrates process steps of another embodiment of the invention.

Thereafter, utilizing appropriate time and temperature parameters, those portions of silicon layer 28 which are exposed through apertures in mask 34 are oxidized down to the level of substrate 10, as shown in FIG. 9. The oxidation is carried out in a conventional manner using, for example, local oxidation of silicon (LOCOS) procedures. In this step, portions of silicon nitride layer 32 act as an oxidation barrier. Thus, the spaces between the active areas are filled with oxide 36, dielectrically isolating the active areas, since their bottom portions are also isolated by corresponding portions of oxide layer 14. Alternatively, rather than oxidizing directly the portions of silicon layer 28 which are exposed through apertures in mask 34, those portions may first be etched down to a predetermined level and thereafter oxidized to form an oxide recessed below the original surface level. Silicon nitride layer 32 and oxide layer 30 are then removed, as shown in FIG. 10A, thus leaving exposed the crystalline surface of dielectrically isolated islands 38 of silicon layer 28 which are in a pattern corresponding to a desired layout of active areas. As another alternative, the portions of silicon layer 28 which are exposed through apertures in mask 34 can be etched away totally down to substrate 10, thereby leaving islands 38 airisolated on their sides, as shown in FIG. 10B.

Thereafter, conventional fabrication techniques may be utilized to form solid-state devices within dielectrically isolated islands 38. For example, CMOS devices may be fabricated in isolated islands 38 using a process similar to that described in LOW-THRESHOLD LOW-POWER CMOS/SOS FOR HIGHFREQUENCY COUNTER APPLICATIONS, A. C. Ipri et al., IEEE Journal of Solid State Circuits, Vol. SC-11, No. 2, April, 1976, pp. 329–336. Moreover, such devices can be fabricated conventionally, utilizing the same masks as utilized for monolithic fabrication of the same devices using junction isolation, thereby obviating the need to develop and prove new masks.

Figure 11:
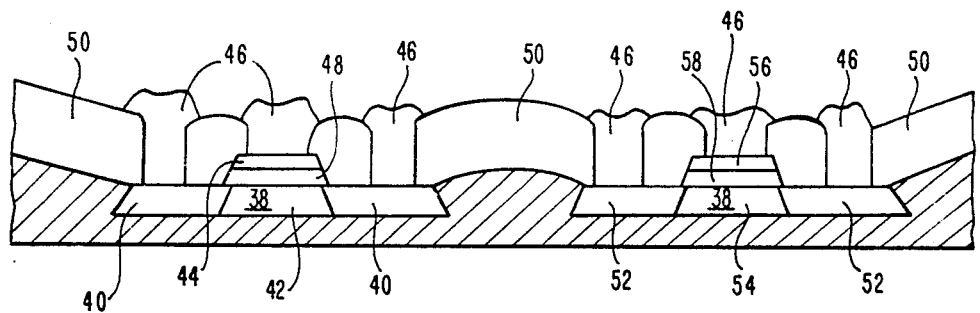
FIG. 11 illustrates a device made in accordance with the invention.

FIG. 11 shows a typical resulting transistor arrangement, somewhat simplified for clarity, utilizing isolated islands 38. Regions 40 are P+-doped source and drain electrode regions of a P-channel FET device, wherein 42 is an N−-doped channel region subject to control by a polysilicon gate electrode 44 formed on an oxide layer 48. Aluminum electrodes 46 provide electrical contact with the source, drain, and gate electrodes. Layer 50 is an insulating layer, for example, boro-phosphor-silicate glass (BSPG), which exhibits known desirable properties for the present application. However, other types of insulators may be utilized, as known in the art. Regions 52 are N+-doped source and drain regions of an N-channel FET device, wherein 54 is a P−-doped channel region subject to control by a polysilicon gate electrode 56 formed on an oxide layer 58. Aluminum electrodes 46 provide respective electrical contact for the source, drain, and gate electrodes.

While the invention has been described by way of an exemplary embodiment, it will be apparent to those skilled in the art that a number of variations may be introduced in the various steps which are substantial equivalents thereof. For example, while the same or substantially the same mask is intended to be used in the process in accordance with the invention as can have been used in producing a junction isolated device, it is herein recognized that it may be preferable that mask apertures be biased to slightly larger dimensions for the process in accordance with the invention to allow for oxide encroachment into the ELO. The former and similar such variations are intended to be within the spirit and scope of the invention, as defined by the following claims.

In the claims:

1. A method for forming dielectrically isolated transistors on a silicon wafer, comprising:
   (a) providing a silicon wafer having a substantially flat major surface and having a monocrystalline portion at said major surface;
   (b) forming a first insulating layer on said major surface;
   (c) defining a plurality of device regions on said major surface in accordance with a mask pattern;
   (d) removing portions of said first insulating layer in regions of said major surface not included in said device regions so as to form a plurality of apertures therethrough exposing said monocrystalline portion, said apertures being spaced no wider apart than a predetermined distance;
   (e) epitaxially depositing silicon within said apertures and over said first insulating layer so as to form a continuous monocrystalline layer of silicon having a thickness substantially equal to said predetermined distance;
   (f) oxidizing substantially all of the surface of said monocrystalline layer of silicon so as to transform a uniformly thick layer of said monocrystalline layer of silicon into oxide;
   (g) removing all of said oxide so as to expose a surface of said monocrystalline layer of silicon;
   (h) forming a second insulating layer over said monocrystalline layer of silicon;
   (i) depositing a layer of silicon nitride ($Si_3N_4$) over said second insulating layer;
   (j) defining said plurality of device regions on said layer of silicon nitride in accordance with said mask pattern;
   (k) removing portions of said silicon nitride and said second insulating layer not included within said device regions so as to form apertures therethrough exposing said surface of said monocrystalline layer of silicon;
   (l) treating said monocrystalline layer of silicon such as to replace portions of said monocrystalline layer of silicon exposed by said apertures by a dielectric down to said major surface of said silicon wafer so as to result in dielectric isolation between separate ones of said plurality of device regions; and
   (m) forming devices in respective ones of said plurality of device regions.

2. A method in accordance with claim 1, wherein said continuous monocrystalline layer of silicon is substantially planar.

3. A method in accordance with claim 1, wherein Step (f) further comprises oxidizing by heating at a predetermined temperature, at a predetermined pressure, for a predetermined time so as to transform a layer of a desired thickness of said monocrystalline layer of silicon into oxide.

4. A method in accordance with claim 1, wherein Steps (f) and (g) are repeated a predetermined number of times so as to transform a layer of a desired thickness of said monocrystalline layer of silicon into oxide.

5. A method in accordance with claim 1, wherein Step (g) comprises removing by immersion in buffered HF.

6. A method in accordance with claim 1, wherein Step (c) is performed by utilizing a mask and Step (j) is performed by utilizing the same mask.

7. A method in accordance with claim 1, wherein said devices comprise field effect transistors.

8. A method in accordance with claim 7, wherein said transistors comprise complementary symmetry transistors.

9. A method in accordance with claim 1, wherein Step (l) comprises oxidizing said portions of said monocrystalline layer of silicon exposed by said apertures.

10. A method in accordance with claim 1, wherein Step (l) comprises removing said portions of said monocrystalline layer of silicon exposed by said apertures.

11. A method in accordance with claim 1, wherein Step (l) comprises removing a portion of said monocrystalline layer of silicon exposed by said apertures, and thereafter oxidizing a remaining portion of said portions of said monocrystalline layer of silicon exposed by said apertures.

* * * * *